United States Patent [19]

Ichihashi et al.

[11] Patent Number: 4,560,640
[45] Date of Patent: Dec. 24, 1985

[54] PHOTOSENSITIVE HIGH POLYMER, EASILY INSOLUBILIZED WHEN CROSS-LINKED BY LIGHT, A METHOD FOR PREPARATION THEREOF, AND A COMPOSITION THEREOF

[75] Inventors: Taichi Ichihashi, Osaka; Wasaburo Kawai, Kawanishi; Tadashi Naraoka, Takaishi; Takateru Asano, Sakura, all of Japan

[73] Assignees: Director-General of Agency of Industrial Science & Technology, Sakai; Sanbo Chemical Industries Co., Ltd., Tokyo, both of Japan

[21] Appl. No.: 619,461

[22] Filed: Jun. 11, 1984

[30] Foreign Application Priority Data

Jun. 13, 1983 [JP] Japan ............... 58-106402

[51] Int. Cl.$^4$ .................. G03C 1/68; C08F 224/00; C08F 218/02
[52] U.S. Cl. ..................... 430/280; 526/273; 526/307.7; 204/159.14; 430/285; 430/287
[58] Field of Search ............ 430/280, 287, 285; 526/273, 307.7; 204/159.14

[56] References Cited

U.S. PATENT DOCUMENTS 3,409,593 11/1968 Messwarb et al. .

FOREIGN PATENT DOCUMENTS 156941 12/1980 Japan .................. 430/280
15418 1/1984 Japan .................. 526/273

OTHER PUBLICATIONS

Matsushita Electric Industrial Co. Ltd.: "Photosensitive Resins" Chemical Abstracts, vol. 100, abstract No. 210966d of Japanese Kokai Tokkyo Koho, Japan 15,418 of Jan. 26, 1984.

*Primary Examiner*—John E. Kittle
*Assistant Examiner*—Cynthia Hamilton
*Attorney, Agent, or Firm*—Armstrong, Nikaido, Marmelstein & Kubovcik

[57] ABSTRACT

A photosensitive high polymer which is a random copolymer comprising a structural unit represented by the formula

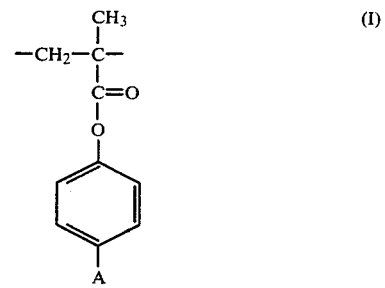

wherein A is

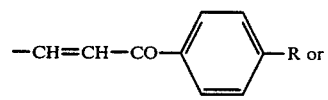

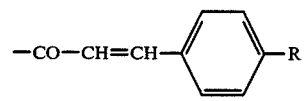

wherein R is hydrogen, methyl or methoxy and a structural unit represented by the formula

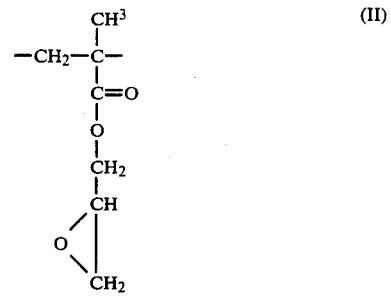

the polymer containing about 5 to about 80 mole % of structural units of the formula (I) and having a polymerization degree of about 300 to about 3000, a process for preparing the photosensitive high polymer and a composition comprising the photosensitive high polymer and solvent.

10 Claims, No Drawings

PHOTOSENSITIVE HIGH POLYMER, EASILY INSOLUBILIZED WHEN CROSS-LINKED BY LIGHT, A METHOD FOR PREPARATION THEREOF, AND A COMPOSITION THEREOF

The present invention relates to a novel photosensitive high polymer which can be easily insolubilized when crosslinked by light.

Semiconductor integrated circuits or the like are prepared generally by coating a silicon wafer or like substrate with a photosensitive material, exposing the coating to light through a photomask after drying, developing the substrate to form an intricate fine pattern, etching the substrate at the areas other than the pattern areas and further subjecting the substrate to other steps including thermal diffusion and vacuum evaporation. Generally used as such photosensitive materials are mixtures of cyclicized rubber, novolak resin or the like with photosensitive substances such as azide compounds. However, these conventional materials do not have sufficient ability to form fine patterns and have their photosensitivity impaired by the oxygen in air to exhibit reduced resolution, so that there is a need to intimately contact the photomask with the photosensitive material. This causes damage to the photomask. The conventional materials have another drawback of undergoing dark reaction which causes gelation during preservation.

Further recently, photosensitive materials are frequently used as protective films for light sensor elements, integrated circuits, etc. In this case, the photosensitive material must be highly transparent, but the conventional photosensitive materials are markedly colored and are therefore greatly limited in usefulness.

The photosensitive materials of the type described, which must be satisfactory in the above properties, also need to be excellent in resistance to heat, water, solvents, etching and soldering baths, and in adhesion to the substrate. Nevertheless, photosensitive materials which are outstanding in all of these characteristics still remain to be developed. In order to manufacture semiconductor products of improved performance by a simplified process, it is presently desired to provide photosensitive materials which are outstanding in the foregoing characteristics and which are useful for forming patterns and also for forming protective films.

The main object of the present invention, which has been accomplished in view of the present situation described, is to provide a potosensitive high polymer which has higher ability to form intricate fine patterns than the conventional materials because of its improved photosensitivity and resolution, is unlikely to cause damage to photomasks and is outstanding in transparency, adhesion to substrates, stability during storage and resistance to heat, water, solvents, etching and soldering baths.

We have already disclosed a photosensitive high polymer which has benzalacetophenone and alkyl as side chains with an intervening ester linkage and which is useful for preparing coating compositions or printing plates (Examined Japanese Patent Publication No. 14352/1974). However, this polymer has the problem of being unsatisfactory in heat resistance and adhesion to the substrate for use in the field of semiconductors.

To overcome the problem, we have conducted intensive systematic research and found that a specific high polymer containing both glycidyl and benzalacetophenone in its side chains has high ability to form patterns and exhibits high performances in transparency, adhesion to substrates, stability during storage and resistance to heat, water, solvents, etching and soldering baths. The present invention has been accomplished based on this novel finding.

Stated more specifically, the present invention provides a photosensitive high polymer which is a random copolymer comprising a structural unit represented by the formula

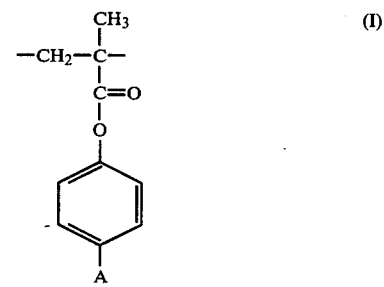

wherein A is

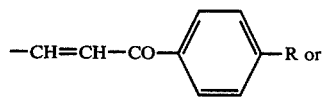

or

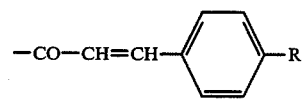

wherein R is hydrogen, methyl or methoxy and a structural unit represented by the formula

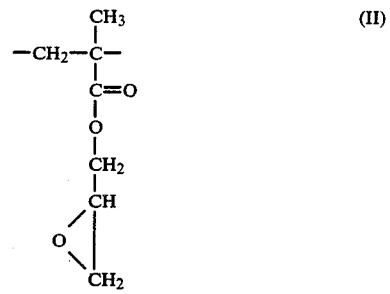

the polymer containing about 5 to about 80 mole % of structural units of the formula (I) and having a polymerization degree of about 300 to about 3000.

The photosensitive high polymer present invention comprises structural units represented by the formula (I) and having benzalacetophenone and structural units represented by the formula (II) and having glycidyl, both units being arranged randomly. The former to latter unit ratio is about 5:95 to about 80:20, preferably about 10:90 to about 30:70, in terms of mole % ratio. If the proportion of the former is more than 80 mole %, the polymer is unable to form a coating of sufficient strength, whereas if it is less than 5 mole %, the resulting coating tends to exhibit reduced photosensitivity and resolution, hence undesirable. Further the degree of polymerization of the present polymer, i.e. the combined number of structural units is about 300 to about 3000, preferably about 500 to about 2500. If the polymerization degree is lower, reduced photosensitivity and heat resistance will result, whereas if the degree is higher, the polymer encounters difficulty in forming coatings, with the tendency that the pattern developed is low in sharpness.

The photosensitive high polymer of the present invention is prepared from glycidyl methacrylate (hereinafter referred to as "GMA") and at least one compound selected from the group consisting of 4-methacryloyloxybenzalacetophenone (hereinafter referred to as "4-MBA"), 4'-methacryloyloxybenzalacetophenone (hereinafter referred to as "4'-MBA"), 4-methyl-4'-methacryloyloxybenzalacetophenone (hereinafter referred to as "4-methyl-4'-MBA"), 4-methoxy-4'-methacryloyloxybenzalacetophenone (hereinafter referred to as "4-methoxy-4'-MBA"), 4'-methyl-4-methacryloyloxybenzalacetophenone (hereinafter referred to as "4'-methyl-4-MBA") and 4'-methoxy-4-methacryloyloxybenzalacetophenone (hereinafter referred to as "4'-methoxy-4-MBA"), by subjecting these compounds to radical copolymerization in specified amounts in accordance with the foregoing ratio of structural units usually in solvent in the presence of polymerization initiator. Examples of useful solvents are those already known, such as cyclohexanone, xylene, methyl isobutyl ketone, ethyl acetate, dioxane, tetrahydrofuran, etc. One or at least two of these solvents are used. Examples of useful polymerization initiators are those already known, such as benzoyl peroxide, di-t-butyl peroxide, azobisisobutyronitrile, acetyl peroxide, etc., at least one of which is used. For polymerization, the monomer concentration is usually about 2 to about 40% by weight, preferably about 10 to about 30% by weight, in terms of the combined amount of the monomers to be reacted. The polymerization initiator is used in an amount usually of about 0.1 to about 5% by weight, preferably about 0.5 to about 3% by weight, based on the combined amount of the monomers. The polymerization is conducted at a temperature usually of room temperature to about 100° C., preferably about 40° to about 70° C., for about 30 minutes to several days, preferably about 1 to about 24 hours, more preferably about 2 to about 5 hours. The reaction affords a viscous solution, from which the desired photosensitive high polymer can be separated off by a usual method, for example, by adding to the solution methanol or like solvent in which high polymers are sparingly soluble to obtain a solid product and filtering off and drying the solid product. The present high polymer thus obtained is soluble in xylene, dioxane, tetrahydrofuran and like solvents and is used usually as dissolved in such a solvent to a concentration of about 5 to about 15% by weight. When required, 1,2-benzoanthraquinone, 5-nitroacenaphthene or like sensitizer may be added to the solution to give increased sensitivity.

When the high polymer of the present invention is exposed to light of up to about 400 nm in wavelength, the polymer containing benzalacetophenone groups is insolubilized by being crosslinked, for example, as represented by the following equation.

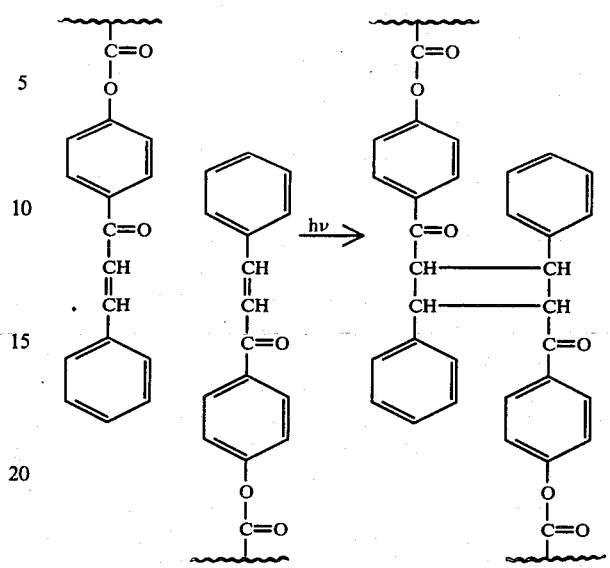

The present polymer has very high sensitivity to light to undergo this reaction. For example, it is several times higher in sensitivity than commercial photosensitive materials of the polyvinyl cinnamate. This feature assures a great advantage when the photosensitive high polymer is applied to a silicon wafer or like substrate and then exposed to light through a photomask for forming a fine pattern, because the polymer, which is highly sensitive, can be crosslinked with a reduced amount of light, i.e. by a method wherein the image of the photomask is projected onto the polymer instead of placing the photomask in intimate contact with the polymer coating. Further because the photosensitivity of the present polymer is not influenced by the oxygen, etc. in air, the polymer especially is suited to this method of exposure. Thus, the substrate can be processed without causing damage to the photomask. The polymer also exhibits high resolution and is therefore fully useful for forming patterns with fineness of the order of 1 μm which is said to be the limit of light exposure method. The present polymer, which remains almost free of the foregoing reaction in the dark, has exceedingly high storage stability.

The photosensitive high polymer of the invention is not only transparent and highly resistant to water, solvents, etching and soldering baths but is also outstanding in heat resistance and adhesion to substrates because it has glycidyl groups. For example, when coatings of the present polymer are postbaked after etching, the coating remains almost free of thermal deformation. The coating further withstands a soldering bath at 250° to 260° C., with its high transparency substantially retained at the same level at this elevated temperature.

Accordingly the photosensitive high polymer of the present invention is very useful for manufacturing semiconductor integrated circuits, etc. by precision processes and is also well-suited for processing light sensor elements wherein high transparency and high resistance to water and heat are essential.

The present invention will be described in greater detail with reference to the following examples.

EXAMPLE 1

A 19 g quantity of 4'-MBA and 62 g of GMA were dissolved in 300 g of xylene, and 0.5% of benzoyl peroxide was added to the solution based on the weight of monomers. The mixture was heated at 65° C. for 4 to 5 hours for copolymerization to obtain a consistent solution. The solution was placed into methanol to separate out the resulting polymer, which was filtered off and dried. The copolymer was in the form of a powder and found to have a number average molecular weight of about 100,000 (polymerization degree: about 560) by GPC analysis. A 10% dioxane solution of the copolymer was about 30 centipoises (25° C.) in viscosity. The 4'-MBA content of the copolymer was about 25 mole % as determined by UV spectral analysis.

The powder was dissolved in dioxane to obtain a 10% solution, which was applied to a silicon substrate by the centrifugal method to obtain a coating about 0.4 to 1 μm in thickness. The coating was dried in air, further dried in a vacuum and then prebaked at 80° C. The coating was exposed to light projected thereon through a photomask and developed with a mixture of xylene and dioxane, whereby a fine pattern with 1 μm-wide lines was formed on the substrate. The developed pattern had no raised area. When postbaked at 160° C., the pattern remained sharp at the edges and exhibited good adhesion to the substrate. When immersed in a soldering bath at 250° to 260° C. for 10 seconds, the coating exhibited satisfactory resistance.

The same polymer solution as above was applied to a light sensor element having a bonding pad to form a thin coating thereon, then exposed to light for curing through a photomask at the areas other than the bonding pad area and thereafter developed, whereby the areas other than the pad area were covered with a transparent film. The photosensitive high polymer of the invention is of such type that the —CH=CH—CO— portion of the molecule is crosslinked by photodimerization, and this reaction is not susceptible to the influence of oxygen, so that the foregoing procedures can be carried out easily in air.

While the rubber-type photosensitive material prepared by admixing 2,6-di(4'-azidobenzal)cyclohexanone with cyclized isoprene has a distinct color, the polymer of Example 1 of the invention was at least 87% in transparency (coating thickness: 15 μm).

For further comparison, a copolymer was prepared from 4'-MBA and n-butyl methacrylate (4'-MBA content: 25 mole %). This photosensitive material exhibited poor adhesion to substrates, and the pattern formed was easily collapsed when the coating was postbaked, but the coating of Example 1 was free of any of these problems, hence a distinct difference.

EXAMPLES 2 to 4

A copolymer of GMA and a monomer, i.e. 4-MBA, 4-methyl-4'-MBA or 4-methoxy-4'-MBA, was prepared by adding to a solution of the composition listed in Table 1 0.5% by weight of azobisisobutyronitrile as an initiator based on the monomers and subjecting the mixture to copolymerization reaction at 60° C. for 4 to 5 hours. The consistent solution obtained was placed into methanol to separate out the copolymer, which was filtered off and dried. Table 1 shows the number average molecular weight and the content of photosensitive monomer in the resulting copolymer. A 10% dioxane solution of the copolymer of Example 2 had a viscosity of about 35 centipoises (25° C.).

TABLE 1

| Example | Monomer | (g) | GMA (g) | Dioxane (g) | Molecular weight | Content of photosensitive monomer |
|---|---|---|---|---|---|---|
| 2 | 4-MBA | 12.5 | 30 | 150 | 150000 (800)* | About 30 mole % |
| 3 | 4-Metyl-4'-MBA | 10.0 | 25 | 150 | 80000 (440)* | About 25 mole % |
| 4 | 4-Methoxy-4'-MBA | 10.0 | 25 | 130 | 100000 (530)* | About 25 mole % |

*The polymerization degree is given in the parentheses.

These copolymers were all photosensitive although slightly different in the range of wavelengths of light to which they were sensitive. They formed fine patterns with 1 μm-wide lines when exposed to light and developed in the same manner in Example 1. They were found comparable to the polymer of Example 1 in respect of adhesion to substrates, heat resistance, transparency, etc.

What we claim is:

1. A photosensitive high polymer which is a random copolymer comprising a structural unit represented by the formula

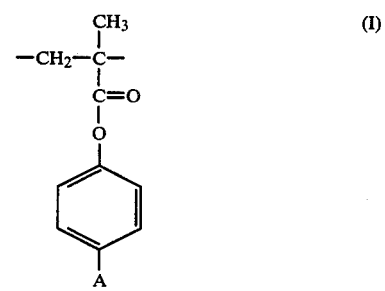

wherein A is

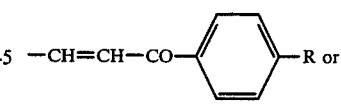

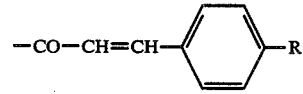

wherein R is hydrogen, methyl or methoxy and a structural unit represented by the formula

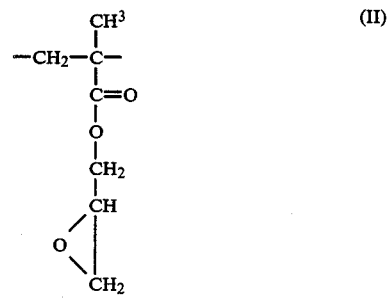

the polymer containing about 5 to about 80 mole % of structural units of the formula (I) and having a polymerization degree of about 300 to about 3000.

2. A photosensitive high polymer as defined in claim 1 which contains about 10 to about 30 mole % of structural units represented by the formula (I).

3. A photosensitive high polymer as defined in claim 1 which has a polymerization degree of about 500 to about 2500.

4. A process for preparing a photosensitive high polymer as defined in claim 1 which is characterized in that (a) at least one compound selected from the group consisting of 4-methacryloyloxybenzalacetophenone, 4'-methacryloyloxybenzalacetophenone, 4-methyl-4'-methacryloyloxybenzalacetophenone, 4-methoxy-4'-methacryloyloxybenzalacetophenone, 4'-methyl-4-methacryloyloxybenzalacetophenone and 4'-methoxy-4-methacryloyloxybenzalacetophenone, and (b) glycidyl methacrylate are subjected to copolymerization in solvent in the presence of polymerization initiator.

5. A process as defined in claim 4 wherein the ratio of (a) monomer to (b) monomer is about 5:95 to about 80:20 in terms of mole %.

6. A process as defined in claim 5 wherein the ratio of (a) monomer to (b) monomer is about 10:90 to about 30:70 in terms of mole %.

7. A process as defined in claim 4 wherein the monomer concentration of the system to be polymerized is about 2 to about 40% by weight in terms of the combined amount of the monomers to be reacted.

8. A process as defined in claim 4 wherein the polymerization initiator is used in an amount of about 0.1 to about 5% by weight based on the combined amount of the monomers to be reacted.

9. A process as defined in claim 4 wherein the polymerization is conducted at a temperature of room temperature to about 100° C.

10. A high-polymer composition which is a solvent solution of about 5 to about 15% by weight of a photosensitive high polymer defined in claim 1.

* * * * *